(12) United States Patent
Durand et al.

(10) Patent No.: US 6,483,339 B1
(45) Date of Patent: Nov. 19, 2002

(54) SINGLE FLUX QUANTUM SERIES BIASING TECHNIQUE USING SUPERCONDUCTING DC TRANSFORMER

(75) Inventors: Dale J. Durand, Irvine, CA (US); Quentin P. Herr, Torrance, CA (US); Mark W. Johnson, La Canada Flintridge, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/935,310

(22) Filed: Aug. 22, 2001

(51) Int. Cl.[7] .............................................. H03K 19/195
(52) U.S. Cl. .............................. 326/5; 326/7; 327/368
(58) Field of Search ........................ 326/1–7; 327/186, 327/366–368, 527–528

(56) References Cited

U.S. PATENT DOCUMENTS 4,623,804 A * 11/1986 Goto ............................... 326/5
5,191,236 A * 3/1993 Ruby ........................... 327/186
5,942,997 A * 8/1999 Silver et al. .................. 341/133

FOREIGN PATENT DOCUMENTS

JP 63179622 A * 7/1988 .......... H03K/17/92

* cited by examiner

*Primary Examiner*—Michael Tokar
*Assistant Examiner*—James H Cho
(74) *Attorney, Agent, or Firm*—Ronald M. Goldman (57) ABSTRACT

The level of bias current (12) required by a superconductor integrated circuit (2 & 4) is lowered by separating the circuit into portions having separate ground planes and supplying the bias current to the circuit portion (2) in one ground plane in series (10) with that for the circuit portion (4) in another ground plane. To maintain DC isolation between those circuit portions, SFQ pulses inputted (SFQ IN) move across the separate ground planes through a pair of inductively coupled SQUIDS (3 & 5) that define a DC transformer; and a combiner (7) reconstitutes and outputs the SFQ pulses. To provide inductive coupling the DC transformer includes a primary (25) and isolated secondary (5) winding.

12 Claims, 3 Drawing Sheets

SINGLE FLUX QUANTUM SERIES BIASING TECHNIQUE USING SUPERCONDUCTING DC TRANSFORMER

STATEMENT OF GOVERNMENT RIGHTS

This invention was made with Government support under Contract No. DMEA 90-99-D-0003 awarded by the Defense Microelectronics Activity. The government has certain rights in this invention.

REFERENCE TO PRIOR APPLICATIONS

This application includes certain subject matter contained in an application of Herr, Ser. No. 09/934,493, filed Aug. 22, 2001, concurrently herewith entitled, "Double Flux Quantum Superconductor Driver, " and the prior application of Herr, Abelson &, Kerber, Ser. No. 09/882,979 filed Jun. 15, 2001, entitled "Capacitor for Signal Propagation Across Ground Plane Boundaries in Superconductor Integrated Circuits," both of which are copending herewith, and which are assigned to the assignee of the present application.

FIELD OF THE INVENTION

This invention relates to superconductor devices and, more particularly, reduction of bias current demand required in superconductor integrated circuits to power large numbers of Josephson Junctions contained within the integrated circuits, and to coupling circuits for superconductor single flux quantum pulses.

BACKGROUND

Metals, metal alloys and ceramics found to exhibit zero electrical resistance are commonly referred to as superconductors. Typically, those superconductors don't attain the superconductive state unless cooled to extremely low temperatures, referred to as cryogenic temperatures. Each such superconductor material possesses a unique cryogenic temperature, referred to as the transition temperature ("Tc"), at which the respective metal and metal alloy becomes superconducting, changing in electrical resistance from a measurable or relatively high value of resistance to zero. One known superconductor is niobium, a refractory metal, which transitions to a superconducting state at a temperature of 9.2 Kelvin.

Superconductor digital electronic devices have previously been constructed of superconductor metals and the functionality of such devices demonstrated. As example, with a zero-resistance characteristic during superconductivity, electrical current induced into a loop formed of the superconductor metal, refrigerated below the transition temperature of the metal, persists indefinitely. With appropriate drivers and sensors, the foregoing loop may serve as a digital memory. When the direction of the current induced in the loop is in a clockwise direction the memory state may represent a "1" digital bit; when the direction of induced current is counterclockwise, the memory state may represent the bit "0".

Superconductor digital electronics devices have been fabricated as integrated circuits on a silicon wafer using the photo-lithographic mask and etch techniques or other known techniques most familiar to those in the semiconductor industry. Such superconductor integrated circuit devices provide the desired functionality in a very small package or chip. Superconductor devices operate at very high speeds, as example, 100 GHz to 770 GHz, and very low power, which is unattainable with present semiconductor devices. Because of the high speeds of operation and low power requirement, superconductor electronic devices remain attractive for many applications.

A principal element to the construction of a superconductor digital electronic device is the Josephson junction. The Josephson junction is formed, as example, of two layers of superconductors, such as niobium, separated by a very thin layer of electrical insulation, such as aluminum oxide. When cooled to the transition temperature and biased with DC current below a certain "critical current", ("$I_c$") the Josephson junction is superconducting and the junction conducts current without developing a voltage drop there across and without dissipation of energy, exhibiting no electrical resistance. Consequently, the junction does not produce heat, which is a significant advantage for integrated circuits. If biased above the critical current, the Josephson junction produces an RF signal, consisting of a series of pulses at RF frequencies. Thus, the critical current is a boundary at which the electrical properties of the junction changes as described.

Superconductor circuits utilize the foregoing property of the Josephson junction to regenerate single flux quantum ("SFQ") pulses. The time integral of the voltage of a single flux quantum pulse is a physical constant approximately equal to 2.07 millivolt picoseconds or, in alternate terms, 2.07 milliamp picohenry. When an SFQ pulse is applied to a Josephson junction that is properly DC biased below the critical current, the current produced by the SFQ pulse when added to the DC bias current may cause the Josephson junction to briefly exceed the critical current. The Josephson junction then undergoes a 360 degree shift in quantum phase or, as otherwise termed, electronically "flips-over". In undergoing that shift the Josephson junction generates an SFQ pulse in response to the applied SFQ pulse.

In superconducting integrated circuit ("IC") devices containing multiple Josephson junctions, the junctions are formed on a common superconductor metal layer, referred to as a ground plane, deposited over an insulator substrate, such as silicon, a readily available and inexpensive material. The multiple Josephson junction devices may be logically divided into groups of two or more junctions, the groups referred to as "SQUIDS" (an acronym for superconducting quantum interference device). For example, a single flux quantum pulse transmission line, referred to as a Josephson transmission line, may be formed of a number of SQUIDS arranged in serial order, each SQUID containing two Josephson junctions connected electrically in parallel in a superconducting loop, the latter also sometimes referred to as a Josephson loop.

A single flux quantum pulse applied to the input of the Josephson transmission line ("JTL"), may be said to propagate along the transmission line to the output, moving from SQUID to SQUID in that line, and thence to the electrical load connected to the output of the transmission line. In fact, the SFQ pulse is regenerated at each Josephson junction (stage), which can produce current and power gain. The transmission line may in total contain two or more Josephson junctions, the number of Josephson junctions (and SQUIDS) that form the transmission line can be increased to traverse the desired distance.

At present, powering (e.g. biasing) superconducting single flux quantum circuits requires very low DC voltage, but appreciable current. Typically, the DC bias supply must supply about 0.1 mA to each Josephson junction contained within a superconducting IC. With many such junctions (or SQUIDS) in a superconductor device, the total bias current is cumulative and in total is very large. Existing techniques for powering Josephson Junctions in superconductor circuits (e.g. SFQ circuits) are based on a parallel bias, that is, bias current supplied to the circuits in parallel, in which all the superconductor digital gates and functional blocks thereto have a common circuit ground. Increasing the number of gates increases the current demand required of the power bus and the DC bias power supply that supplies the power to that bus.

For superconductor circuits of several thousand gates (e.g. SQUIDS) or larger, more than one ampere of total current is required, which is relatively large for integrated circuit devices. Requiring large current at low voltage, even at power levels as low as one milliwatt, presents at least two disadvantages. First, semiconductor power converters presently available do not deliver an ampere of current at one millivolt in voltage as efficiently as they deliver one milli-amp current at one volt of voltage. Secondly, the transmission of larger currents from an external current supply, positioned in the ambient temperature, to the cryogenic package containing the superconductor circuits implies electrical conductors for the power bus that are large in cross-section.

The large cross section of the power bus conductors, in addition to conducting current, provides a thermal path from the ambient into the cryogenic package that is of greater thermal conductivity than with bus's of small cross-section. Due to the greater thermal conductivity, more heat could be conducted into the cryogenic package. The addition of heat to the cryogenic package is obviously undesirable, since the heat increases the requirements for refrigeration to maintain the circuits in the superconductive state, also lowering efficiency. As an advantage the present invention is able to power large numbers of SQUIDS without increasing the cross-sectional area of the power bus.

The problem of powering large numbers of SQUIDS in a superconductor integrated circuit while maintaining the lowest level of current demand on the power supply (or power supplies) was earlier recognized by one of the co-inventors, who, with others, jointly conceived a new biasing arrangement for the SQUIDS, one that separated the paths for transmission of SFQ pulses (the AC path) from the paths for supplying bias current. In that new biasing arrangement multiple SQUIDS of a large Josephson transmission line are supplied with DC bias current in a series a circuit, instead of the existing practice of being supplied that bias current in parallel circuit. The foregoing invention is the subject of a copending application for patent, Ser. No. 09/882,979, filed Jun. 15, 2001, by Herr, Abelson and Kerber (the "'979 Herr et al application"), entitled, "Capacitor for Signal Propagation Across Ground Plane Boundaries in Superconductor Integrated Circuits", assigned to the assignee of the present application.

That new biasing arrangement reduces the total electrical DC bias current requirement (e.g. current demand) that was previously necessary to properly bias all the SQUIDS contained in a Josephson transmission line. Prior to the foregoing invention, the SQUIDS of a Josephson transmission line were supplied with DC bias current in parallel, producing a current demand that was a multiple of the bias current required by a single SQUID.

Although engineers in the superconductor art are familiar with series electrical circuits, the prior art did not contain a practical way to power the multiple SQUIDS in series and still obtain a functional superconductor device. The conundrum was that one could DC isolate the SQUIDS from one another and supply the bias current to the SQUIDS in series circuit, without being able to transfer an SFQ pulse from one SQUID to another, rendering the formed Josephson transmission line dysfunctional; and one could transfer a SFQ pulse from SQUID to SQUID in a functional Josephson transmission line, but only if the SQUIDS were not DC isolated from one another, and, hence, were supplied with DC bias current from the power supply in parallel.

The '979 Herr et al application disclosed a means for reducing or eliminating the self-inductance in the wiring to a capacitor installed in a superconductor integrated circuit device, specifically a Josephson transmission line. The structure in effect produces a negative inductance to counter-act the inherent self-inductance of the capacitor wiring, producing, ideally, a net zero self-inductance. Applying that discovery, an SFQ pulse could then successfully pass through a capacitor in a superconductor circuit, avoiding the dominant absorptive effect of the series self-inductance of the capacitor wiring inherent at the propagation speeds of the SFQ pulses.

Incorporating the new capacitors of the '979 Herr et al application in series in the SFQ pulse transmission path (e.g. the AC path) of the Josephson transmission line, the AC transmission path becomes distinct from the DC bias current path. Separate SQUIDS in the Josephson transmission line could thereby be maintained electrically DC isolated from one another. Thus the DC isolated SQUIDS may then be wired in DC series circuit; and the DC bias current supply need supply bias current to that series circuit of multiple SQUIDS at the level of current required to bias a pair of Josephson Junctions in one of the SQUIDS, instead of the higher levels previously required. Power supplies that deliver smaller levels of current at higher voltage are more practical, readily available, less expensive and smaller in size that those that are required to supply very high current at low voltage. The foregoing innovation in biasing rendered Josephson transmission lines and any other superconductor device containing large numbers of Josephson Junctions more practical.

Like capacitor coupling, those in the field also recognize the transformer as a means to couple an AC signal from one circuit location to another and as a way to concurrently DC isolate the one circuit from the other. A transformer contains a primary winding and a secondary winding which are DC isolated from one another. If the side of the circuit that functions with the secondary is connected to a ground that is isolated from the ground of the first circuit location, an AC signal may effectively pass through the transformer, but not the DC, which is blocked. Even possessed of such basic knowledge, no one has heretofore been known to accomplish the foregoing in a superconductor circuit and reduce the level of bias current to that circuit. As an advantage the present invention accomplishes both functions.

Accordingly, a principal object of the present invention is to reduce the level of electrical current required to power a superconductor device.

A further object of the invention is to significantly reduce the DC current draw required to power superconductor ICs containing large numbers of Josephson junctions.

Another object of the invention is to permit single flux quantum pulses to propagate across ground plane boundaries in superconductor integrated circuits.

Still another object of the invention is to provide a new biasing arrangement for superconductor integrated circuits; and An ancillary object of the invention is to employ a superconductor transformer to provide DC isolation between portions of a superconductor circuit.

SUMMARY OF THE INVENTION

In accordance with the foregoing objects and advantages, the level of bias current required by a superconductor integrated circuit is lowered by separating the circuit into portions that have separate ground planes and supplying the bias current to the circuit portion in one ground plane in series with that for the circuit portion in the other ground plane. To maintain DC isolation between those circuit portions, a pair of inductively coupled SQUIDS that define a DC transformer is provided so that SFQ pulses inputted to the circuit move across the separate ground planes through the SQUIDS. A combiner reconstitutes and outputs the SFQ pulses at the circuit output. To provide inductive coupling the DC transformer includes a primary and an isolated secondary winding.

In accordance with a more specific aspect to the invention, a superconductor flip-flop is used to split a train of SFQ pulses into separate pulse trains of odd numbered SFQ pulses and even numbered SFQ pulses, respectively. The latter pulse trains are applied to respective inputs to the primary of a DC transformer, which effectively lies in the first ground plane, and those pulse trains are coupled to a DC isolated secondary, which effectively lies in the second ground plane. The two pulse streams thereby bridge the ground planes. A combiner recombines the two pulse streams into a single pulse stream, thereby reconstituting the original pulse stream that was inputted to the toggle flip-flop. The components that lie within the first and second ground planes, respectively, include appropriate bias inputs. The first circuit ground is coupled to the bias inputs of those components that lie in the second ground plane, and the external source of bias connects between the bias inputs of those components that lie in the first ground plane and the second ground plane, thereby supplying bias current to the two sets of components in series.

The foregoing and additional objects and advantages of the invention, together with the structure characteristic thereof, which were only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE PREFERRED EMBODIMENTS

Figures 1, 2:
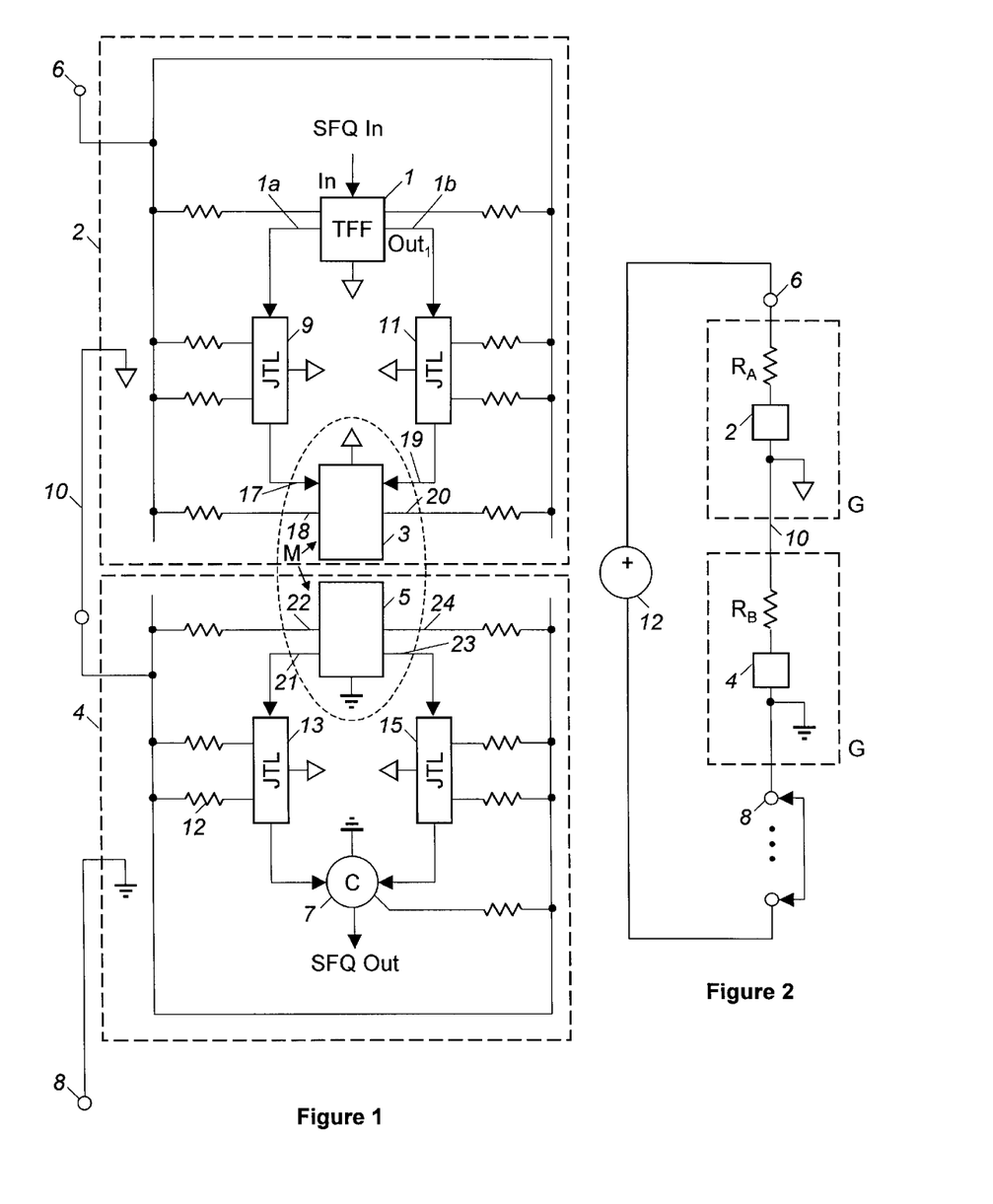
FIG. 1 is a schematic an embodiment of the invention.
FIG. 2 is a schematic of the bias arrangement included in the embodiment of FIG. 1.

FIG. 1, to which reference is made, schematically illustrates an embodiment of the superconductor circuit constructed in accordance with the invention. The superconductor circuit contain a superconductor toggle flip-flop 1, a pair of magnetically coupled SQUIDS 3 and 5, sometimes referred to herein as a superconductor transformer, a superconductor combiner 7 and four Josephson transmission lines 9, 11, 13 and 15, all of which are components known in the superconductor art. The foregoing components are connected in circuit to permit SFQ pulses to essentially move from the input of the circuit at SFQ IN to the circuit output SFQ OUT of combiner 7, discussed later in greater detail in connection with the operation of the circuit. Resistors R, only one of which is labeled, are in series circuit with the DC bias current circuit to the respective components illustrated, later herein more fully described.

The schematic of FIG. 1 also illustrates the bias and grounding used in the circuit. Each of the foregoing superconductor devices requires a DC bias current for operation. For that purpose, each device component in the figure is connected to a ground or, more appropriately a circuit ground. Those components in each portion of the circuit that are connected to the same circuit ground are surrounded by a dash-line box. Thus, box 2 includes toggle flip-flop 1, Josephson transmission lines 9 and 11 and one portion 3 of the DC transformer. Those components in the box are connected to one circuit ground, indicated by the triangle symbol. Box 4 includes the other portion 5 of the DC transformer, Josephson transmission lines 13 and 15 and combiner 7; and those components in the box are connected to a different circuit ground indicated by a different ground symbol. One polarity terminal of the bias supply is connected to bias input 6. The return circuit to the other polarity terminal of the bias supply is connected to bias output 8.

The circuit ground of the components associated with box 2 is connected by a lead 10 to the bias input circuit of the components associated with box 4. The foregoing connection places the bias circuits of the two portions of the circuit in series to the bias supply. However, the elements within each of the two boxes are connected to the bias current source in parallel. As example, both of the Josephson transmission lines 9 and 11 in box 2 are connected in a bias current circuit between bias input terminal 6 and the respective circuit ground and the bias circuits of the two transmission lines are in parallel.

The foregoing series connection of the bias circuits for the circuit components associated with each of boxes 2 and 4 is more clearly illustrated by the separate, more general, schematic of FIG. 2 to which reference is made. For convenience, the identification of those elements of FIG. 1 are respectively identified by the same number where those elements appear in FIG. 2. A bias source 12 connects between the input 6 and output 8 to form a complete DC current loop between one polarity terminal of the bias supply, through the circuits in boxes 2 and 4 and a return to the other polarity terminal of the bias supply. $R_A$ and $R_B$ represent the equivalent resistance of the bias circuits in boxes 2 and 4, respectively.

FIG. 2 more clearly shows that bias circuits of additional superconductor circuits, not illustrated, that is, circuits in addition to that of boxes 2 and 4, may be included in the series bias circuit as long as such additional circuits contain circuit grounds that are isolated from the circuit grounds of all other circuit grounds in the other parts of the electronic system. As example, an additional superconductor circuit can be supplied with bias current by breaking the connection between terminal 8 and the return lead to bias supply 12, and inserting the bias circuit of the additional superconductor circuit in series there between. An appropriate adjustment of the voltage level of bias supply 12 is all that is necessary. In the foregoing manner, hundreds of superconductor circuits can be supplied with DC bias current from a single bias current source.

Returning to FIG. 1, toggle flip-flop 1, represented in block form, contains a single input and two outputs, 1a and 1b, and is located at the pulse-receiving end of the superconductor circuit. The flip-flop toggles an output high between the two outputs of the flip-flop in sequence, toggling states each time an SFQ pulse is received at the flip-flop input. Although different in structure than the more familiar toggle flip-flops found in semiconductor digital apparatus, the foregoing superconductor toggle flip-flop performs the same function. The foregoing superconductive toggle flip-flop circuit is known in the superconductor art and is commercially available a more detailed discussion of such structure is not necessary and the flip-flop may be represented simply in block form.

The two outputs of the toggle flip-flop are coupled to Josephson transmission lines 9 and 11, respectively and feed into those transmission lines. The outputs of the latter transmission lines are coupled, respectively, to inputs 17 and 19 of SQUID 3 of the transformer and respectively feed into those inputs. The outputs 21 and 23 of SQUID 5 of the transformer respectively couple to the inputs of Josephson transmission lines 13 and 15. The output of Josephson transmission line 15 is coupled to the other input of the combiner. The output of Josephson transmission line 13 is coupled to one of the two inputs of combiner 7. The output of combiner 7 serves as the output of the superconductor circuit, which is to be coupled to additional electronic circuits.

The foregoing Josephson transmission lines may be formed of two Josephson Junctions, the self-inductance of the wiring leads, and, optionally a resistor included in shunt of each of those junctions. Analogous to the familiar passive transmission line, an SFQ pulse is propagated along the transmission line with a characteristic velocity. Unlike a passive transmission line, however, the Josephson junctions, regenerates the SFQ pulse, as the pulse travels from junction to junction in the transmission line. The Josephson transmission line is active, enabling the transmission line to have a power gain, and is non-linear due to the fact that the output pulse amplitude is not proportional to the amplitude of the input pulse.

The superconductor transformer is recognized as a known component in the superconductor art. Magnetically coupled SQUIDS 3 and 5, which forms the superconductor transformer, is illustrated schematically in greater detail in FIG. 3 to which reference is made. The transformer contains primary and secondary windings 25 and 27 in a 1:1 turn relationship. The windings are electrically insulated from one another but are magnetically linked, and each winding includes inductance. The magnetic coupling factor, k, of the windings is close to 1.0, as example 0.9 or more, but always less than 1.0, which is physically unattainable. The transformer is core-less.

Figure 3:
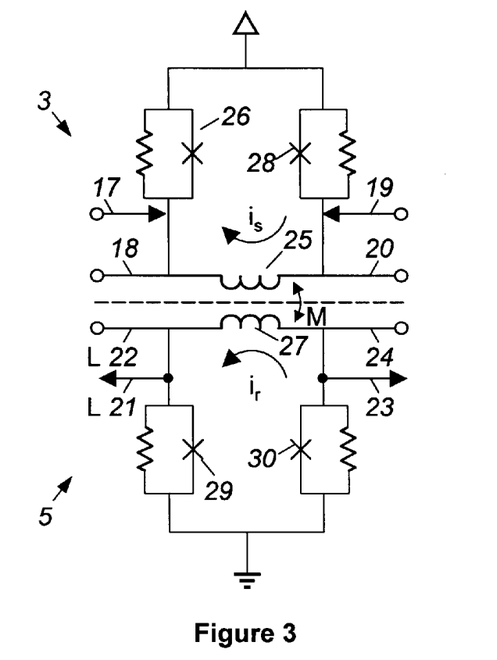
FIG. 3 is a more detailed schematic of the superconductor transformer used in the embodiment of FIG. 1.

SQUID 3 includes two Josephson Junctions 26 and 28, one of which connects between an end 18 of the primary and terminal 27 to the circuit ground for the SQUID; and the other of which connects to the other end 20 of that winding and the circuit ground. Likewise, SQUID 5 also contains two Josephson Junctions 29 and 30 connected, respectively, between respective ends, 22 and 24, of the secondary 27 and the separate circuit ground for SQUID 5.

Each junction is shunted by a resistance, not numbered. Those shunt resistors, as is known, are used to produce an effective junction with the correct the "I-V", characteristic, which as is known, indicates the dynamic behavior of the shunted junction. However, for certain design approaches and for certain junction types, those resistors, are not necessary to the operation of the invention, and, may be omitted. As is also known, SFQ circuits generally use critically damped Josephson junctions. That means the value of the resistor placed in shunt of the junction is chosen such that the Stewart-McCumber parameter, known in the art, is near unity. That condition corresponds to relaxation of voltage "ringing", internal to the junction, in a minimum amount of time. For example, a junction having a critical current of 0.5 mA and internal capacitance of 0.7 pF, typical values for a junction, is critically damped by a shunt resistor of one ohm resistance. By thereby adjusting the I-V characteristic of the particular Josephson Junction selected for use in the circuit with the shunt resistor, multiple flux quantum switching in the junction within a single cycle is prevented.

Terminals 18 and 20, representing the ends of the primary 25, are connected to respective resistors in the bias circuit (see FIG. 1). Terminals 17 and 19 of SQUID 3, through which SFQ pulses are coupled to Josephson junctions 26 and 28, respectively, connect to the respective outputs of Josephson transmission lines 9 and 11 (FIG. 1). In the secondary, terminals 22 and 24 connect to respective resistors in the bias circuit for SQUID 5. The output terminals 21 and 23 to the secondary 27 connect to a respective input of Josephson transmission lines 13 and 15 (FIG. 1), respectively.

The Josephson Junctions 26 and 28 in SQUID 3 are different from the other Josephson Junctions. The junctions are formed with a central insulator of a wider area, and, hence, the junctions possess a critical current that is greater than that for the other Josephson junctions, as example, those junctions in the Josephson transmission line and those junctions in SQUID 5. Together with the inductance of winding 25 the two Josephson junctions 26 and 28 define a superconductor dual input bi-stable flip-flop device that is basic to the function of transformer operation.

Figure 4:
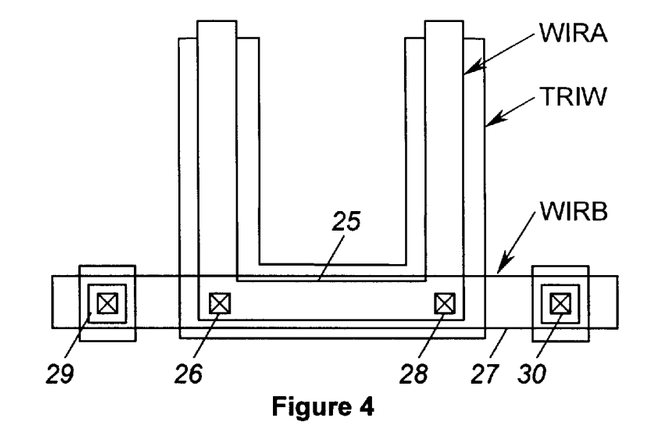
FIG. 4 is a not-to-scale pictorial layout of an integrated circuit superconductor transformer component of FIG. 3
Figure 5:
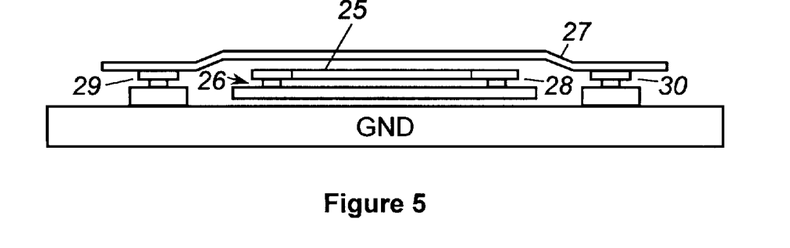
FIG. 5 is a partial side view of the layout of FIG. 4.

Physically, in an integrated circuit the primary and secondary windings 25 and 27 of the two SQUIDS are formed by two short lengths of superconductor metal, representing a quarter-turn winding, such as illustrated in the top and side layout views of FIGS. 4 and 5 to which reference is made. In these figures, the number used to designate an element is the same number used for the element in the schematic of FIG. 3. The short length of metal strip that forms the transformer primary (and the self-inductance of that winding) is shown as 25; that of the secondary is shown as 27. Those short lengths of superconductive metal strips are located in spaced overlying relationship so that the magnetic flux produced by a pulse of current one winding links with the second winding so as to induce a voltage in the latter winding (e.g. the windings are magnetically coupled indicated by the symbol M in FIG. 1). Although the terms "winding" and "turn", traditionally used for conventional transformers, are used to describe the wiring in the transformer, that wiring is less than a single-turn, unlike the multiple turns found in traditional transformer windings that are formed by coiling one or more turns of wire around a magnetic core.

Returning to FIG. 3, in brief, the defined flip-flop of SQUID 3 functions as follows. Normally the Josephson junctions in SQUID 3 are biased slightly below the critical current and are superconducting. An SFQ pulse applied to a Josephson junction 26 raises the current above the critical current level to generate an SFQ pulse. The pulse produces a current that flows in one direction through the inductance (and winding), and, due to the nature of superconducting electronics, that current persists (e.g. the circuit is stable in that condition). That current produces a magnetic flux, which is coupled to secondary winding 27. When an SFQ pulse is then applied to Josephson junction 28, that junction is driven above critical current, which halts the current produced by junction 26 and produces a current through the inductance (and winding) in the opposite direction from that produced by junction 26. The latter current persists (e.g. the circuit is stable in the new condition), producing a magnetic flux in the opposite direction, which is magnetically coupled to secondary winding 27.

When a further SFQ pulse is applied to Josephson junction 26, the foregoing process repeats with junction 26 producing a persistent current in the primary flowing in the first direction, and so on as additional SFQ pulses are received serially at alternate junctions. Effectively inputs 17 and 19 may be regarded as a SET input and RESET input, respectively, for the flip-flop. SQUID 3 provides a bi-stable source of current and flux that transitions from one direction of current flow to another only when a SFQ pulse is applied to the appropriate SET or RESET input terminal.

Figure 6:
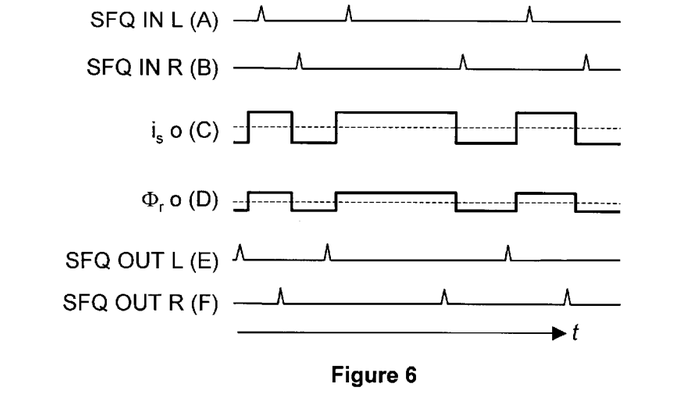
FIGS. 6(a)–6(f) are timing diagrams of various SFQ pulses and waveforms occurring at various locations within the superconductor transformer of FIG. 3 during operation to assist in describing the operation of the invention.

The foregoing functions in the superconducting transformer are graphically illustrated in the chart of FIG. 6 to which reference may be made. FIG. 6(a) illustrates a train of SFQ pulses applied at 17 to junction 26 at the input (e.g. SET input) of the flip-flop; and FIG. 6(b) illustrates train of SFQ pulses applied at 19 to junction 28 at the second input (e.g. RESET input) of the flip-flop with the pulses in this train trailing in time those pulses in the pulse train of FIG. 6(a). FIG. 6(c) illustrates the current through primary 25 and FIG. 6(d) the flux produced by that winding. With each pulse at input 17, the current in the primary (and flux) increase and persist over time, until a pulse is input at input 19. When the pulse at 19 occurs (FIG. 6(b)), the current in primary 26 (and the flux) reverses in direction and persists, producing a rectangular shaped wave-shape.

When the current in primary 25 rose in response to the SFQ pulse at input 17, the voltage induced in the secondary 27 by the change of flux produced by the primary current is sufficient to trigger Josephson junction 29 above critical current, producing an SFQ pulse as shown in FIG. 6(e). When the flux produced by the primary current reverses, the change is sufficient to trigger Josephson junction 30 above critical current, producing an SFQ pulse as shown in FIG. 6(f). Comparing the pulses of FIGS. 6(a) and 6(b) with the corresponding output SFQ pulses at FIGS. 6(e) and 6(f), one appreciates that the SFQ pulses output from the transformer are essentially in synchronism with the RFQ pulses outputted from the secondary side of the transformer. The superconductor transformer is capable of effectively moving SFQ pulses between two DC isolated circuits without adversely affecting that DC isolation. The foregoing is recognized as a brief summary of the known device, and, for additional detail, the reader is referred to the technical literature.

Both Squids in FIG. 3 are designed to have the correct parameters and are statically flux biased so they act as flip-flops with two stable states. The magnetic coupling between the primary and secondary windings, M, should be large enough so that the state in the Squid (located on ground plane B) is determined by the state of the SQUID (located on ground plane A). If the foregoing condition is met, SFQ data may be transmitted from one end to the other, passed from ground plane A to ground plane B.

Ideally the magnetic coupling factor, "k", between the primary and secondary of the transformer is nearly 1.0. As later noted, if design constraints for a practical embodiment prevent achieving that coupling factor for the transformer windings, then an alternative approach is taken, as later herein described in connection with the embodiment of FIG. 7.

Returning to FIG. 1, for operation the superconductor circuit is refrigerated below the critical temperature for the components, typically either 4 or 10 degrees Kelvin, and appropriate DC bias is applied through the bias input 6 of the circuit, which powers all of the components. In operation, the SFQ pulses that are to be passed through the circuit originate in external equipment, not illustrated, and may be part of a train of the high speed data pulses that define a digital communication or other information. That train of SFQ pulses is applied to the input, SFQ IN, of toggle flip-flop 1, the front end of the superconductor circuit. In turn, for each pulse received, the flip-flop provides a pulse at a respective one of the two outputs 1a and 1b.

A serial pulse train of SFQ pulses consists of pulses that are either odd or even in serial order starting with the first pulse. Output 1a may be placed in the high output state when odd numbered SFQ pulses are received at the input to the flip-flop, changing to the opposite output state when an even numbered pulse is received at that input. Output 1b will be placed in the high output state when even numbered SFQ pulses are received at the input, changing to the opposite output state when odd numbered SFQ pulses are received at the input to the flip-flop. The toggling action of the flip-flop thereby produces a pair of pulse trains whose pulses are out-of-phase with each other; and each of those output pulse trains contains one-half the number of pulses found in the pulse train applied to the input of the flip-flop.

The pulses outputted from outputs 1a and 1b of the flip-flop are respectively inputted into Josephson transmission lines 9 and 11, respectively. The SFQ pulses propagate through the respective transmission lines, with the pulses from line 9 preceding the corresponding pulses from line 11 (as in FIGS. 6(a) and 6(b)).

The SFQ pulses exiting the respective Josephson transmission lines are inputted to a respective input, 17 and 19, of the DC transformer, namely, SQUID 3, the "send" SQUID. Assuming that the SFQ pulse from transmission line 9 is first to arrive, the pulse produces a current that flows in one direction through the transformer primary and produces a corresponding magnetic flux that is linked to the secondary, located in SQUID 5. The next pulse that arrives is from transmission line 11, which reverses the current through the primary and the direction of the magnetic flux. As succeeding SFQ pulses are input, the magnetic flux changes direction in one direction and the other. Each reversal of flux in one direction results in SQUID 5 producing an SFQ pulse at one of the outputs, 21 and 23, of the transformer and the reversal of flux to the opposite direction produces an SFQ pulse at the other of those outputs. The operation of the transformer was earlier described in connection with FIGS. 3 and 6 which is not here repeated.

The SFQ pulses at outputs 21 and 23 of the transformer are input to Josephson transmission lines 13 and 15, respectively. The pulses propagate through those lines and are output to respective inputs of superconductor combiner 7. In turn the combiner combines the two pulse trains into a single pulse train, effectively reconstituting the train of SFQ pulses that was applied at the circuit input SFQ IN, and supplies the single pulse train to the circuit output at SFQ OUT.

As those skilled in the art recognize, the shunt resistors to the Josephson junctions are not required for operation of the embodiment. They are included to note a practical design consideration and to ensure completeness, as they are incorporated in a practical embodiment of the applicant's invention. Shunt resistors are customarily included to adjust or tailor, if desired, the I–V characteristic of the particular Josephson Junction selected for use in the circuit, which is a known adjustment technique. One may decide to forego use of such resistors, and operate at less than optimal conditions; and the invention will still perform as described. Moreover, different makes of practical Josephson junctions may have a desired I–V characteristic in the first instance and no adjustment is necessary. Hence, other practical embodiments of the foregoing invention might not require any tailoring of the Josephson Junctions with shunt resistors.

As earlier described, the magnetic coupling factor between the primary to secondary of the superconductor transformer formed by SQUIDS 3 and 5 in the embodiment of FIG. 1 needs to be close to 1.0 in value. Referring again to the side view of the transformer (used in the embodiment of FIG. 1) that is illustrated in FIG. 5, the foregoing coupling factor is determined by the physical spacing of the primary and secondary windings, 25 and 27, to the metal ground plane GND. If the coupling constant achieved is much less than unity, then the changing magnetic flux obtained at the secondary would be insufficient to generate SFQ pulses at output terminals 21 and 23. For various reasons not material to the present invention, the spacing that would be required to achieve coupling constant near unity cannot be achieved in a general purpose superconducting integrated circuit fabrication process. Thus, in some integrated circuit designs that coupling factor cannot be achieved. To overcome that difficulty, the corrective approach presented in a second embodiment to the invention is taken, which is next considered.

In a straightforward attempt to implement the coupled SQUIDS described above using a standard fabrication process a high enough coupling constant to produce a practical device could not be achieved. Two approaches could be used to produce a practical device: 1) Change the fabrication process, or 2) Increase the size of the variable current supplied to primary 25 of the transformer. While it is possible to change the fabrication process to provide a high enough coupling constant, it is likely to be less expensive to instead pursue alternative methods to increase the current supplied to the primary of the transformer. Prospective changes to the fabrication process are not relevant to the present invention and are not described. The variable current in the primary of the transformer can be increased in two ways that can be used individually or together. The first is to add a resistor in series with the primary inductor. The second is to use a recent invention by a co-inventor of the present invention, a driver that generated a double quantum flux pulse at an output when a SFQ pulse is applied to the input of the driver. That invention is the subject of the copending application for patent of Herr, Ser. No. 09/934,493, filed Aug. 22, 2001, concurrently herewith, entitled "Double Flux Quantum Superconductor Driver," the content of which is incorporated herein by reference.

Figure 7:
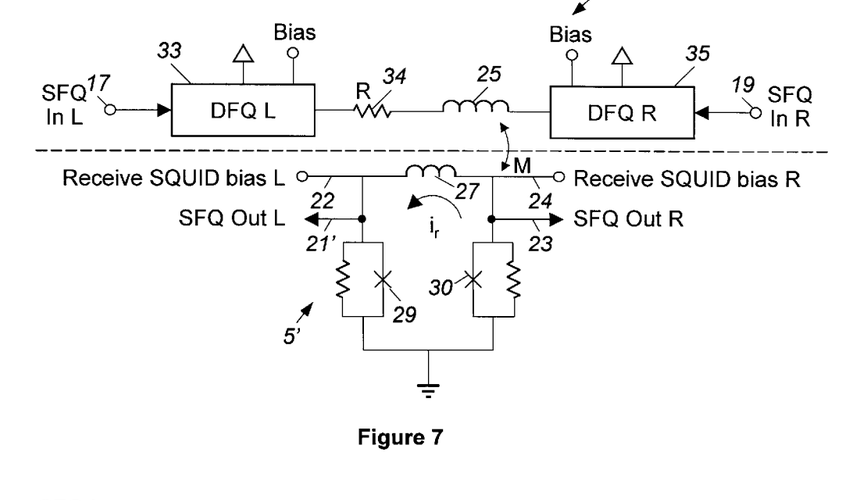
FIG. 7 is a schematic partially illustrating an alternative embodiment of the transformer component used in the embodiment of FIG. 1.

Reference is made to the schematic of FIG. 7, which partially illustrates an alternative DC transformer to substitute for the one used in the embodiment of FIG. 1. In this figure, the numbers used to identify elements previously illustrated and described are used in this figure to identify those same elements where they appear. The schematic of FIG. 7 incorporates both of the foregoing techniques for increasing the variable current applied to the primary of the transformer used together. The Junctions 26 and 28 of the flip-flop included in SQUID 3 of the transformer of FIG. 3 is replaced with a pair of double quantum flux drivers 33 and 35, illustrated in block form, and a resistor 34 is included in series with the primary. Each driver is supplied with a bias current (BIAS). As with the transformer of FIG. 3, SQUID 3, containing the primary is in one ground plane; SQUID 5, containing the secondary is in a different ground plane, isolated from the former ground plane.

The embodiment operates in the same manner as the embodiment of FIG. 1. The difference is in the detail of operation of the transformer. Each driver, 33 and 35, transforms the SFQ pulses, respectively applied to inputs 17 and 19 of SQUID 3, to respective double flux quantum pulses; and those double flux quantum pulses are respectively applied to the opposite ends of the primary 25 in series with resistor 34. Compared to the circuit shown in FIG. 3, the current applied to the primary of the circuit shown in FIG. 7 resulting from each SFQ pulse input to ports 17 or 19 is twice as large.

The primary and series resistor provide a light load for the double flux quantum drivers. That is, the impedance of the winding and series resistor is about eight times the characteristic impedance of the Josephson transmission line in the driver. Instead of an SFQ pulse being applied to the ends of primary 25, double flux quantum pulses are applied. Because the resulting current in the primary is more intense than with SFQ pulses, the magnetic flux is doubled. Because the magnetic coupling factor is less than 1.0, each flux reversal during operation produces a voltage across the secondary that is less than the size of the double flux quantum pulse voltage, but at least as great as that of an SFQ pulse, which is the desired result.

Additionally, resistor 34 causes the current in the primary of the transformer to decay with a characteristic time, $\tau$, equal to the ratio of the inductance 25 to the resistance 34: $\tau=L(25)/R(34)$ instead of persisting as it does for the circuit shown in FIG. 3. The decay of the inductor current effectively resets the drive circuit automatically in the short time interval between successive input SFQ pulses. Specifically, an SFQ pulse in port 17 initially causes a positive current in inductor 25. Resistor 34 then causes the current to decay to zero. A successive pulse into port 19 initially causes a negative current in inductor 25. Resistor 34 then causes the latter current to decay to zero. The total change of primary current is twice as large as it would be in the absence of resistor 34. Using the double flux quantum drivers, 33 and 35, with the resistor 34, the total change in the current through inductor 25 is four times as large as that for the circuit shown in FIG. 3. As a result of incorporating both techniques in the circuit, ample current is produced in the primary that ensures generation of a sufficient pulse in the secondary.

Figure 8:
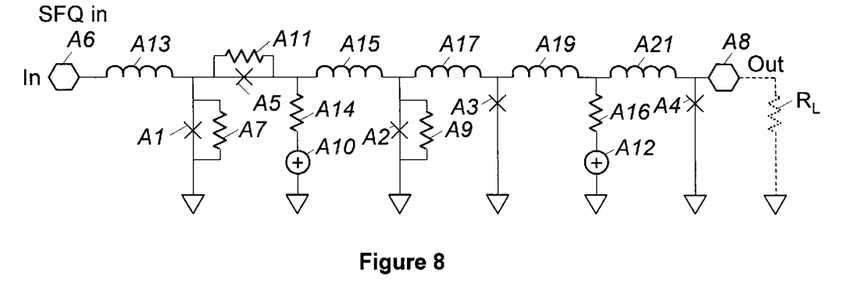
FIG. 8 is a schematic of a double quantum flux superconductor driver used in the embodiment of FIG. 7.

Reference may be made to FIG. 8 and the accompanying description for a more detailed review of the double flux quantum driver used in the embodiment of FIG. 7. The double quantum flux ("DFQ") driver in FIG. 8 contains five Josephson Junctions A1, A2, A3, A4 and A5, illustrated by the symbol "X", five inductors A13, A15, A17, A19, and A21; and resistances A7, A9, A11, A14 and A16. Josephson Junctions A3 and A4 and inductance's A17, A19 and A21 form a Josephson transmission line; and Junctions A1 and A2 together with inductance's A13, and A15 in a sense form another Josephson transmission line; and that the two transmission lines are series connected to form a longer transmission line connected between and input A6 and an output A8. However, Josephson junction 5 is located in the first transmission line proximate input A6 and following junction A1. That junction functions as a one-way bypass or gate for SFQ pulses, later herein more fully described. Due to that by-pass action, the second named Josephson transmission line may thus be referred to either as a transmission line containing a one-way bypass or as a "one-way buffer". Although both definitions are technically correct, the latter terminology is believed to be more in keeping with industry practice and is the one frequently used.

The voltage buses that supply bias current to the junctions are represented at A10 and A12. The foregoing buses may be combined, since only a single voltage bus is required. As integrated within the driver of FIGS. 1 and 7 to which brief reference is made, the foregoing bias current is supplied via bias input 6 and outputs to the same circuit ground 10 as the other circuit components associated with the primary 25 side of the driver circuit. Returning to FIG. 8, resistor A14 is in series with the bias supply at A10 and determines the DC bias current level to Josephson junctions A1 and A2. Resistor A16 is connected in series with the bias supply at A12 for Josephson junctions A3 and A4 and determines the DC bias current to those junctions.

Inductors A13, A15, A17, A19, and A21 symbolize the self-inductance of the interconnecting electrical leads in the circuit, which, physically, appear as relatively straight leads. Inductor A13 represents the self-inductance of the lead from input A6 to one side of junction A1 (e.g. the input to the one way gate), and the other end of the latter junction is connected to circuit ground. Junction A5, which serves as the one-way gate, connects between the one side of junction A1 and an end of inductor A15, representing the self-inductance of the electrical lead to a first end of junction A2. The remaining end of junction A2 is connected to circuit ground.

For operation, the driver is connected to a light electrical load $R_L$, represented in phantom lines in the figure. That is, the load is relatively high in resistance, suitably at least three times as great, relative to the value of that shunt resistance which is required to produce a critically damped Josephson junction (e.g. the characteristic impedance of the transmission line), so that the transmission line output should emulate an open-circuit as "seen" from the Josephson transmission line. Briefly, referring again to FIG. 7, the primary 25 and series resistor 34 is a light load that satisfies the foregoing condition.

Continuing with FIG. 8, DC bias current flows through resistor A14 and around to the left through junction A5 (and shunt resistor A11) and through junction A1 (and shunt resistor 7) to ground through which the current returns to the power supply. Current also flows through inductor A15 and junction A2 (and shunt resistor A9) to ground. Resistor A14 sets the bias current level. Preferably the bias is set so that the current equals about 70% of the critical current, $I_c$, for junctions 1 and 5 and for junction 2. All three of the foregoing junctions have approximately the same specified critical current.

On the right side of the figure, DC bias current is supplied through terminal A12 and flows through resistor A16 inductor A19, junction A3 and inductor A23 to ground; and flows through the foregoing resistor, junction A4, and inductor A25 to ground. Preferably the bias is set so that the current equals about 35% of the critical current, $I_c$, for each of junctions A3 and A4. The latter junctions have the same specified critical current. The foregoing driver circuit is cooled to the appropriate low temperature at which the junctions and the metal wiring are superconducting, and, hence, loss-less.

Because the driver output is not resistively damped, if a typical bias was used, the Josephson Junctions A3 and A4 could tend to effectively "run away" and produce multiple pulses when triggered. By requiring a larger current to be applied (to add to the bias current) before the current through the junction exceeds the critical current, proper triggering of the junction "flip-over" is assured. The smaller variations in bias current produced by transients internally within the driver are not sufficient to drive the Josephson Junction beyond the critical current.

As thus prepared, single flux quantum pulses are applied at input A6 of the driver circuit. To describe the operation of the driver, only two of those pulses need be considered. The inputted pulse propagates through inductor A13 and takes the path of least impedance through Josephson junction A1, raising the current through the junction above the critical current of that junction. Junction A1 generates an SFQ pulse, and that SFQ pulse passes to the left and to the right along the metal wiring. That propagating to the left cancels out the input pulse; that to the right propagates through junction A5, which is in the superconducting state, and inductor A15 and is applied to junction A2. The SFQ pulse then causes the current through junction A2 to exceed the critical current of the junction, and, in-turn, that junction generates an SFQ pulse. The foregoing pulse SFQ pulse moves though inductance A17 and is applied to Josephson junction A3. The latter junction regenerates the SFQ pulse, which moves through inductance's A19 and A21 and is applied to Josephson junction A4, located at the output A8 of the Josephson transmission line.

As earlier noted, the foregoing driver circuit is resistively loaded by a relatively high resistive load $R_L$, high relative to the condition for critical damping of the Josephson junction, the latter of which, typically, is about one ohm in resistance, whereby the transmission line effectively emulates an open-circuit transmission line. That is, the discontinuity of the end of the transmission line, the output, creates a reflection of the incident SFQ pulse. Thus, the load for the driver should be one that ranges from about three to eight times the critical damping of a single junction up to an infinitely large value (e.g. an open circuit). One may note that junctions A3 and A4 in the transmission line are not damped, e.g. shunted by resistors to critically damp the respective junctions. Even so, the characteristic impedance, $Z_0$, of the undamped transmission line, which was defined as the value of a shunt resistor that could critically damp one of the Josephson junctions in the line, does not change.

According to conventional Josephson transmission line dynamics, an SFQ pulse at input A6 effectively moves through junctions A1, A2 and A3 (left to right in the figure), triggering a $2\pi$ phase advance in each junction in turn. The SFQ pulse then moves to junction A4. When junction A4 is triggered, the SFQ pulse undergoes a $4\pi$ phase advance, thus producing an output voltage pulse that has twice the amplitude of a SFQ pulse. It is noted that the propagating pulse does not affect junction A5 as the pulse moves to the right toward the output and that junction remains fully conductive, with no electrical resistance. The current produced by the pulse propagating to the right is subtractive to the bias current applied to junction A5, inputted through bias input A10, so junction A5 does not attain the critical current.

The triggering of Josephson junction A4 also produces a back traveling SFQ pulse (e.g. the reflected pulse). The back traveling pulse undergoes additional $2\pi$ phase advances in both junctions A3 and A2 as the pulse effectively propagates in the reverse direction (e.g. right to left in the figure) toward input A6; and then undergoes another $2\pi$ advance in junction A5.

The SFQ pulse then moves further to the left and triggers junction A5. Since the DC bias current through Josephson junction A5 is from input A10 to the left, through junction A1, which is fully conducting, to ground, the current produced by the reflected pulse is in the same direction as the bias current. Being thus additive, the current through the junction exceeds the critical current and the junction triggers. The SFQ pulse thus "escapes" from the circuit, the energy associated therewith being dissipated in shunt resistance A11, and Josephson Junction A1, which cannot be triggered simultaneously with junction A5, is inhibited. This pulse is generated only when the reflected pulse travels from the output of the transmission line to the junction. Thus, junction A5 acts as a one-way bypass device within the Josephson transmission line that shunts reflected pulse from input A6, protecting the input.

By eliminating the impediment of the high current power supply, the foregoing invention makes possible superconductor very large scale integrated circuits, which essentially opens the field to larger and more complex superconductor integrated circuits as could lead to more widespread application of superconductor technology.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. A superconductor circuit for passing SFQ pulses across ground plane boundaries, comprising:

a superconductor toggle flip-flop for receiving SFQ pulses serially at an input and, responsive to said received SFQ pulses, for supplying SFQ pulses alternately between first and second outputs to provide first and second serial pulse streams of SFQ pulses, respectively, at said first and second outputs, respectively, in which SFQ pulses of said first serial pulse stream at said first output leads in time corresponding pulses of said second serial pulse stream at said second output;

a superconductor DC transformer, said superconductor DC transformer including a primary, a secondary, said secondary being DC isolated from said primary, first and second inputs, and first and second outputs;

first superconductor means for applying said SFQ pulses from said first and second outputs of said flip-flop, respectively, to said first and second inputs of said superconductor DC transformer, wherein SFQ pulses from said first serial pulse train produce current in said primary in one direction and SFQ pulses from said second serial pulse train produce current in said primary in a second direction, whereby said superconductor DC transformer reproduces each of said first and second serial pulse trains, respectively, at said first and second outputs of said superconductor DC transformer;

a superconductor combiner having first and second inputs and an output;

second superconductor means for applying said first and second outputs of said superconductor DC transformer,  respectively, to said first and second inputs of said combiner, wherein said superconductor combiner combines said first and second serial pulse trains of SFQ pulses into a single serial pulse train of SFQ pulses to reconstitute said received SFQ pulses serially.

2. The superconductor circuit as defined in claim 1, wherein said first and second superconductor means each comprise a Josephson transmission line.

3. The superconductor circuit as defined in claim 1 wherein said first and second inputs of said superconducting DC transformer further comprises first and second inputs, respectively, to said primary.

4. The superconductor circuit as defined in claim 1, further comprising:

a first bias input;

a first circuit ground;

a second bias input;

a second circuit ground; and said second circuit ground being DC isolated from said first circuit ground;

wherein said superconductor toggle flip-flop, said first superconductor means and said first and second inputs of said primary of said DC transformer each provide a bias current path from said first bias input and said first circuit ground;

wherein said first and second outputs of said secondary of said superconductor DC transformer, said second superconductor means and said superconductor combiner each provide a bias current path between said second bias input and said second circuit ground; and means connecting said first circuit ground to said second bias input to place said respective bias current in series between said first bias input and said second circuit ground.

5. The superconductor circuit as defined in claim 1 wherein said primary of said superconductor DC transformer includes inductance and wherein said superconductor DC transformer further comprises:

first and second Josephson junctions, said first Josephson junction being connected to one of said inputs to said primary and said second Josephson junction being connected to a second input to said primary and with said inductance of said primary defines a superconductor bi-stable flip-flop.

6. The superconductor circuit as defined in claim 4, wherein said superconductor DC transformer further comprises:

third and fourth Josephson junctions, said third Josephson junction being connected to one of said outputs to said secondary and said fourth Josephson junction being connected to said second output to said primary.

7. The superconductor circuit as defined in claim 1, wherein said primary of said superconductor DC transformer includes inductance and wherein said superconductor DC transformer further comprises:

a resistor, said resistor being connected to said first input of said primary to place said resistor in series with said primary;

first and second double flux quantum drivers, each of said double flux quantum drivers having an input and an output for providing a double flux quantum pulse at said output in response to receiving an SFQ pulse at said input;

wherein said first and second inputs of said superconducting DC transformer further comprise, respectively, said inputs of said first and second double flux quantum drivers;

said output of said first double flux quantum driver being connected to said resistor to place said output of said first double flux quantum driver in series with said resistor and said primary; and said output of said second double flux quantum driver being connected to said second input of said primary.

8. A superconductor circuit comprising:

superconductor means for receiving a train of SFQ pulses at an input and supplying a SFQ pulse at a first output in response to each odd numbered ones of said SFQ pulses in said train and supplying a SFQ pulse at a second output in response to each even numbered ones of said SFQ pulses in said train, wherein a pair of pulse trains is produced in which the pulses of one pulse train of said pair of pulse trains trails in time corresponding pulses of the remaining pulse train in said pair of pulse trains;

transformer means having a primary and secondary, said secondary being isolated from said primary;

said primary including a first end for receiving one of said pulse trains and including a second end for receiving the other one of said pulse trains;

means for combining outputs from said secondary to reconstitute said train of SFQ pulses received at said input and supplying said reconstituted train of SFQ pulses to an output.

9. A superconductor circuit, comprising:

first means for receiving a train of SFQ pulses containing odd numbered and even numbered SFQ pulses in a serial order and producing first and second serial trains of SFQ pulses, said first pulse train containing SFQ pulses corresponding to said odd numbered pulses in said received train of SFQ pulses and said second pulse train corresponding to said even numbered pulses in said received pulse train;

first and second ground planes;

said first means being located in said first ground plane and having a bias input for receiving a DC bias current;

a transformer containing a primary and a secondary for producing flux that links to said secondary responsive to current through said primary, said secondary being DC isolated from said primary and from said first ground plane and containing first and second ends;

said primary containing first and second ends and being isolated from said second ground plane;

combiner means for receiving two trains of SFQ pulses and combining said two trains into a single pulse train for application to an output;

said combiner means being located in said second ground plane and having a bias input for receiving a DC bias current;

means for connecting said first ground plane to said bias input of said combiner means to define a series bias circuit, said series bias circuit extending through said bias input of said first means to said second ground plane;

means, located in said first ground plane, for applying said first pulse train to said first end of said primary and said second pulse train to said second end of said primary; and means, located in said second ground plane, for coupling said first end of said secondary to said combiner means and for coupling said second end of said secondary to said combiner means.

10. A superconductor pulse transmission circuit for transmission of SFQ pulses across DC isolated boundaries, comprising:

a superconductor toggle flip-flop for receiving SFQ pulses serially at an input and, responsive to said received SFQ pulses, for supplying SFQ pulses alternately between first and second outputs to provide first and second serial pulse streams of SFQ pulses, respectively, at said first and second outputs, respectively, in which SFQ pulses of said first serial pulse stream at said first output leads in time corresponding pulses of said second serial pulse stream at said second output;

first and second Josephson transmission lines, each of said first and second Josephson transmission lines having an input coupled to a respective one of said first and second outputs of said toggle flip-flop for propagating SFQ pulses received at said input to an output of the respective Josephson transmission line;

a superconducting DC transformer, said superconducting DC transformer including a pair of inputs, a pair of outputs, a primary winding, a secondary winding, said primary and secondary windings being magnetically coupled and DC isolated from one another, and means coupled to said primary winding for coupling said inputs to said primary winding;

said superconducting DC transformer being coupled to said output of each of said first and second Josephson transmission lines for coupling SFQ pulses from said first Josephson transmission line to one of said outputs of said superconducting DC transformer and for coupling SFQ pulses from said second Josephson transmission line to another one of said outputs of said superconducting DC transformer;

a first circuit ground and a second circuit ground;

a first bias input for conducting bias current to at least said superconducting toggle flip-flop, and said first and second Josephson transmission lines;

said superconducting toggle flip-flop and said first and second Josephson transmission lines including a connection to said first circuit ground;

first and second Josephson junctions, each including first and second ends;

third and fourth Josephson transmission lines, each of said third and fourth Josephson transmission lines including an input and an output for receiving SFQ pulses applied at said input and providing corresponding SFQ pulses at said output;

a second bias input for conducting bias current to at least to said first and second Josephson junctions and said third and fourth Josephson transmission lines;

said first end of said first Josephson junction being connected to one end of said secondary winding and to said input of said third Josephson transmission line and said second end of said first Josephson junction being connected to said second circuit ground, wherein said first Josephson junction receives SFQ pulses of a first polarity from said secondary winding and generates corresponding SFQ pulses to apply to said input of said third Josephson transmission line;

said first end of said second Josephson junction being connected to and opposite end of said secondary winding and to said input of said fourth Josephson transmission line and said second end of said second Josephson junction being connected to said second circuit ground, wherein said second Josephson junction receives SFQ pulses of a second polarity from said secondary winding and generates corresponding SFQ pulses to apply to said input of said fourth Josephson transmission line;

an active single flux quantum pulse combiner, said active single flux quantum pulse combiner including a pair of inputs and an output for combining pulse trains applied to said pair of inputs to a single pulse train at said output, whereby two separate pulse trains are merged into a single pulse train that emulates the pulse train received at said input to said toggle flip-flop; and wiring for connecting said first circuit ground to said second bias input.

11. The superconductor pulse transmission circuit as defined in claim 10, wherein said means of said superconducting DC transformer further comprises:

third and fourth Josephson junctions, each of said third and fourth Josephson junctions having first and second ends;

said first Josephson junction for receiving SFQ pulses at said output of said first Josephson transmission line and producing current in one direction through said primary winding;

said first end of said third Josephson junction being connected to one end of said primary winding and to said output of said first Josephson transmission line and said second end of said first Josephson junction connected to said first circuit ground;

said fourth Josephson junction for detecting SFQ pulses at said output of said second Josephson transmission line and producing current through said primary in a second direction;

said first end of said fourth Josephson junction being connected to an opposite end of said primary winding and to said output of said second Josephson transmission line and said second end of said fourth Josephson junction being connected to said first circuit ground.

12. The superconductor pulse transmission circuit as defined in claim 10, wherein said means of said superconducting DC transformer comprises:

a resistor, said resistor being connected to said first input of said primary to place said resistor in series with said primary;

first and second double flux quantum drivers, each of said double flux quantum drivers having an input and an output for providing a double flux quantum pulse at said output in response to receiving an SFQ pulse at said input;

wherein said first and second inputs of said superconducting DC transformer further comprise, respectively, said inputs of said first and second double flux quantum drivers;

said output of said first double flux quantum driver being connected to said resistor to place said output of said first double flux quantum driver in series with said resistor and said primary; and said output of said second double flux quantum driver being connected to said second input of said primary.

* * * * *